United States Patent
Chen et al.

(10) Patent No.: US 11,387,394 B2
(45) Date of Patent: Jul. 12, 2022

(54) MICRO LIGHT-EMITTING DIODE DEVICE

(71) Applicant: PlayNitride Display Co., Ltd., MiaoLi County (TW)

(72) Inventors: Pei-Hsin Chen, MiaoLi County (TW); Yi-Chun Shih, MiaoLi County (TW); Chih-Ling Wu, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 133 days.

(21) Appl. No.: 16/708,445

(22) Filed: Dec. 10, 2019

(65) Prior Publication Data
US 2021/0126171 A1 Apr. 29, 2021

(30) Foreign Application Priority Data
Oct. 28, 2019 (TW) .................................. 108138795

(51) Int. Cl.
*H01L 33/54* (2010.01)
*H01L 33/44* (2010.01)
*H01L 33/62* (2010.01)

(52) U.S. Cl.
CPC .............. *H01L 33/54* (2013.01); *H01L 33/44* (2013.01); *H01L 33/62* (2013.01)

(58) Field of Classification Search
CPC .......... H01L 33/54; H01L 33/44; H01L 33/62
See application file for complete search history.

(56) References Cited

U.S. PATENT DOCUMENTS

| 2007/0205426 A1* | 9/2007 | Inoshita | H01L 33/62 257/99 |
| 2008/0023716 A1* | 1/2008 | Sagimori | B41J 2/45 257/79 |
| 2008/0149945 A1* | 6/2008 | Nagai | H01L 27/156 257/88 |
| 2012/0228580 A1* | 9/2012 | Wang | H01L 27/156 257/E33.012 |

(Continued)

FOREIGN PATENT DOCUMENTS

| TW | 201442559 | 11/2014 |
| TW | 201810709 | 3/2018 |
| TW | 201939739 | 10/2019 |

OTHER PUBLICATIONS

"Office Action of Taiwan Counterpart Application", dated Jun. 15, 2020, p. 1-p. 6.

*Primary Examiner* — Su C Kim
(74) *Attorney, Agent, or Firm* — JCIPRNET

(57) ABSTRACT

A micro light-emitting diode device includes a substrate, a micro light-emitting diode, a first protection layer and a second protection layer. The micro light-emitting diode is adapted to be disposed on the substrate. The first protection layer is disposed on a first portion of an outer side wall of the micro light-emitting diode and has a gap from the substrate. The second protection layer is disposed on a second portion of the outer side wall of the micro light-emitting diode. The second protection layer is located in the gap between the first protection layer and the substrate and covers a part of the first protection layer. A maximum thickness of the first protection layer on the outer side wall is less than a maximum thickness of the second protection layer on the outer side wall.

13 Claims, 3 Drawing Sheets

(56) References Cited

U.S. PATENT DOCUMENTS

2013/0306997 A1* 11/2013 Lim ................... H01L 27/156
                                                          438/34
2016/0307961 A1   10/2016 Shen et al.
2018/0198045 A1*  7/2018 Perzlmaier ............. H01L 33/46

* cited by examiner

MICRO LIGHT-EMITTING DIODE DEVICE

CROSS-REFERENCE TO RELATED APPLICATION

This application claims the priority benefit of Taiwan application 008138795, filed on Oct. 28, 2019. The entirety of the above-mentioned patent application is hereby incorporated by reference herein and made a part of this specification.

BACKGROUND

Technical Field

The disclosure relates to a micro light-emitting diode device, and particularly relates to a micro light-emitting diode device provided with protection layers.

Description of Related Art

With the advancement of the photoelectric technology, the volume of many photoelectric components is gradually miniaturized. In recent years, due to the breakthrough in the size of Light-Emitting Diodes (LEDs), the LEDs can be applied not only to the lighting technology but also to display panels. At present, a micro-LED display formed by arranging the LEDs in array is gaining increasing attention in the market. The micro-LED display belongs to an active LED display, and in addition to being more power-saving than an Organic Light-Emitting Diode (OLED) display, the micro-LED display has better contrast performance and is visible in the sunlight. Besides, since the micro-LED display is made of inorganic materials, the micro-LED display has better reliability and longer service life than the OLED display. How to provide better protection for micro-LEDs is the research object in this field.

SUMMARY

The disclosure provides a micro light-emitting diode device provided with protection layers.

The micro light-emitting diode device provided by the disclosure includes a substrate, a micro light-emitting diode, a first protection layer and a second protection layer. The micro light-emitting diode is disposed on the substrate. The first protection layer is disposed on a first portion of an outer side wall of the micro light-emitting diode and has a gap from the substrate. The second protection layer is disposed on a second portion of the outer side wall of the micro light-emitting diode. The second protection layer is located in the gap between the first protection layer and the substrate and covers a part of the first protection layer. A maximum thickness of the first protection layer on the outer side wall is less than a maximum thickness of the second protection layer on the outer side wall.

In an embodiment of the disclosure, a ratio of the maximum thickness of the first protection layer on the outer side wall to the maximum thickness of the second protection layer on the outer side wall is less than or equal to 0.2.

In an embodiment of the disclosure, a thickness of the second protection layer on the substrate is gradually increased along a direction away from the first protection layer.

In an embodiment of the disclosure, an included angle between the second protection layer and the substrate is an acute angle, and an included angle between the second protection layer and the first protection layer is an acute angle.

In an embodiment of the disclosure, a material of the first protection layer is different from a material of the second protection layer.

In an embodiment of the disclosure, a Young's modulus of the first protection layer is greater than a Young's modulus of the second protection layer.

In an embodiment of the disclosure, a height of the second protection layer on the substrate is less than or equal to 0.5 time a height of the micro light-emitting diode on the substrate.

In an embodiment of the disclosure, the micro light-emitting diode includes a light-emitting layer, and the height of the second protection layer on the substrate is less than a height of the light-emitting layer on the substrate.

In an embodiment of the disclosure, a roughness of the first portion of the outer side wall of the micro light-emitting diode is less than a roughness of the second portion.

In an embodiment of the disclosure, the height of the second protection layer on the substrate is greater than or equal to a height of the first protection layer on the substrate.

In an embodiment of the disclosure, the second protection layer is further disposed on a bottom surface of the micro light-emitting diode and between the micro light-emitting diode and the substrate.

In an embodiment of the disclosure, the second protection layer is a lightproof layer.

Based on the above, the first protection layer of the micro light-emitting diode device provided by the disclosure is disposed on the first portion of the outer side wall of the micro light-emitting diode, the second protection layer is disposed on the second portion of the outer side wall of the micro light-emitting diode, is located in the gap between the first protection layer and the substrate, and covers a part of the first protection layer. Therefore, the micro light-emitting diode device provided by the disclosure can be well protected. By virtue of the design with a narrow top and a wide bottom, subsequent circuits connected to the micro light-emitting diode can be distributed along the outer edges of the first protection layer and the second protection layer, thereby providing a buffering effect on the circuits to reduce the probability that the circuits are broken.

DESCRIPTION OF THE EMBODIMENTS

A micro light-emitting diode described in the embodiments of the disclosure, as used herein, means that a micro component of which a size ranges from 1 micron to 100 microns. In some embodiments, the micro component may have a maximum width of one of 20 microns, 10 microns, or 5 microns. In some embodiments, the micro component may have a maximum height of one of less than 20 microns, 10 microns, or 5 microns. It should be understood that the embodiments of the disclosure are not necessarily limited thereto, and larger or smaller scales may be applied to aspects of some embodiments. A substrate may be, for example, a display substrate, a light-emitting substrate, a substrate having functional components such as thin film transistors or integrated circuits (ICs), or other types of circuit substrates, but is not limited thereto. Although some embodiments of the disclosure specifically describe a micro light-emitting diode including a p-n diode, it should be understood that the embodiments of the disclosure are not limited thereto. Other micro light-emitting diodes may also be applied to some embodiments, including micro light-emitting diodes having a photonic function (for example, laser diodes, and photodiodes).

Figure 1:
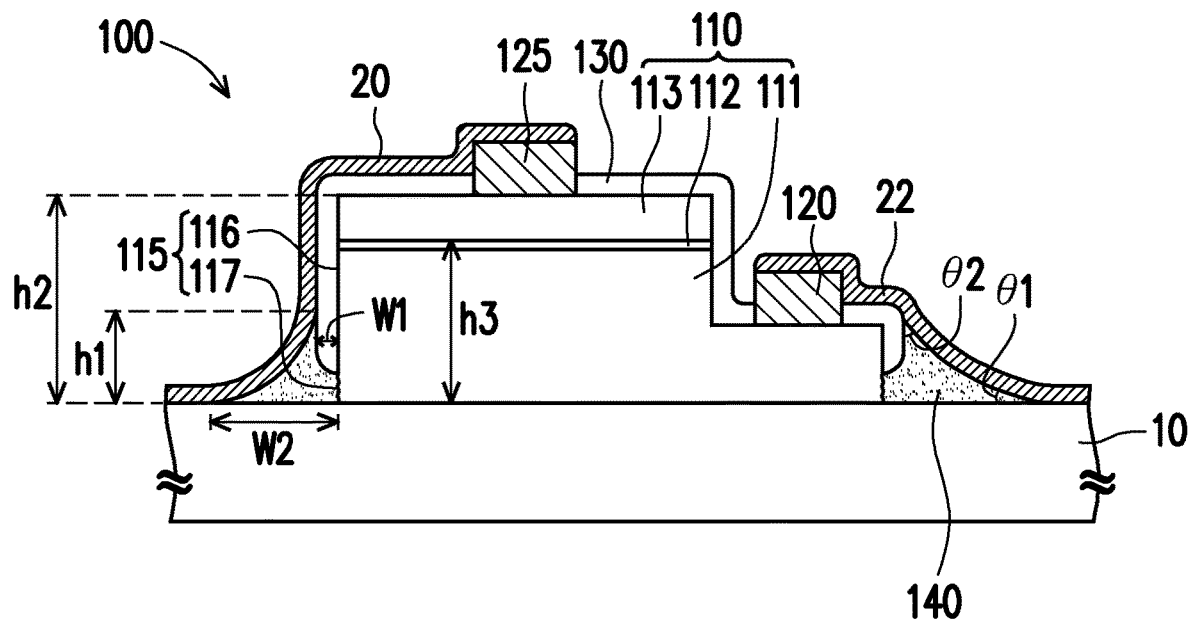
FIG. 1 is a cross-sectional view of a micro light-emitting diode device according to an embodiment of the disclosure.

FIG. 1 is a cross-sectional view of a micro light-emitting diode device according to an embodiment of the disclosure. Referring to FIG. 1, a micro light-emitting diode device 100 of the present embodiment may be a micro light-emitting diode display (micro LED display), and may include other components. These other components include (but are not limited to): a memory, a touch screen controller and a battery. In other implementations, the micro light-emitting diode display may be a television, a tablet computer, a telephone, a laptop computer, a computer monitor, a stand-alone terminal service desk, a digital camera, a handheld game console, a media display, an e-book display, a vehicle display, or a large-area electronic billboard display. The micro light-emitting diode device 100 includes a substrate 10. The substrate 10 is a circuit substrate, and the circuit substrate may be a Complementary Metal-Oxide-Semiconductor (CMOS) substrate, a Liquid Crystal on Silicon (LCOS) substrate, a Thin Film Transistor (TFT) substrate, or other substrates having a working circuit. The substrate 10 may also be a flexible substrate, and the material thereof includes polyester resin (PET), polyethylene naphthalate (PEN), or polyimide (PI).

The micro light-emitting diode device 100 includes a micro light-emitting diode 110, a first protection layer 130 and a second protection layer 140. The micro light-emitting diode 110 is disposed on the substrate 10.

In the present embodiment, the micro light-emitting diode 110 includes a first type semiconductor layer 111 (such as an N type semiconductor layer), a light-emitting layer 112 and a second type semiconductor layer 113 (such as a P type semiconductor layer) stacked sequentially. A thickness of an epitaxial structure of the micro light-emitting diode 110 is preferably from 1 micron to 6 microns, and a too thick or too thin epitaxial structure will affect the yield of subsequent processes. A thickness of the first type semiconductor layer 111 may be greater than a thickness of the second type semiconductor layer 113, wherein the thickness of the first type semiconductor layer 111 is between 1 micron and 5 microns, a thickness of the light-emitting layer 112 is between 0.1 micron and 1 micron, and the thickness of the second type semiconductor layer 113 is between 0.1 micron and 0.5 micron. However, the disclosure is not limited thereto.

Furthermore, in the present embodiment, the micro light-emitting diode 110 is, for example, a horizontal light-emitting diode. A length and a width of the first type semiconductor layer 111 are greater than a length and a width of the second type semiconductor layer 113. In other words, the micro light-emitting diode 110 is of a ladder structure as viewed in a cross section. Herein, a maximum width difference between the first type semiconductor layer 111 and the second type semiconductor layer 113 is between 0 micron and 5 microns, and the first type semiconductor layer 111 and the second type semiconductor layer 113 may be elastically applied to the subsequent design. Of course, in other embodiments, the micro light-emitting diode 110 may also be a vertical light emitting diode.

The micro light-emitting diode device 100 also includes a first type electrode 120 and a second type electrode 125 which are respectively in contact with and are electrically connected to the first type semiconductor layer 111 and the second type semiconductor layer 113. And the first type electrode 120 and the second type electrode 125 are formed by high-work-function metals (such as platinum, nickel, titanium, gold, chromium, alloys thereof and a combination of the above materials), metal oxides (such as indium tin oxide and zinc oxide) or conductive non-metallic materials, such as conductive polymers, graphite, graphene and black phosphorus.

The first protection layer 130 is disposed on a first portion 116 of an outer side wall 115 of the micro light-emitting diode 110 and has a gap from the substrate 10. A second protection layer 140 is disposed on a second portion 117 of the outer side wall 115 of the micro light-emitting diode 110. The second protection layer 140 is located in the gap between the first protection layer 130 and the substrate 10 and covers a part of the first protection layer 130. In the present embodiment, the second protection layer 140 covers a part of the first protection layer 130 on a vertical side surface, but the scope that the second protection layer 140 covers the first protection layer 130 is not limited thereto.

In the present embodiment, because the micro light-emitting diode 110 is the horizontal light-emitting diode, the first type electrode 120 and the second type electrode 125 are located on a top surface of the micro light-emitting diode 110, and the second portion 117, disposed on the outer side wall 115, of the second protection layer 140 is close to a bottom surface of the micro light-emitting diode 110 and away from the first type electrode 120 and the second type electrode 125. Of course, in other embodiments, if the micro light-emitting diode 110 is the vertical light emitting diode, the second protection layer 140 may also be close to the first type electrode 120 connected to the first type semiconductor layer 111.

It should be noted that in the present embodiment, a ratio of a maximum thickness W1 of the first protection layer 130 on the outer side wall 115 to a maximum thickness W2 of the second protection layer 140 on the outer side wall 115 is less than or equal to 0.2. Thus, the first protection layer 130 and the second protection layer 140 may be designed to have a structure with a narrow top and a wide bottom, and circuits 22 and 20 connected to the first type electrode 120 and the second type electrode 125 can be distributed along the outer edges of the first protection layer 130 and the second protection layer 140 to be lowered onto the substrate 10, thereby providing a buffering effect on the circuits 20 and 22 to reduce the probability that the circuits 20 and 22 are broken; and the micro light-emitting diode 10 can be electrically connected with the substrate 10 through the circuits 20 and 22.

In the present embodiment, the second protection layer 140 is in a slope shape. In other words, a thickness of the second protection layer 140 on the left and right sides of FIG. 1 is gradually increased along the direction away from the first protection layer 130, and a thickness of the portion closest to the substrate 10 (portion W2) is maximum. Therefore, an included angle θ1 between the second protection layer 140 and the substrate 10 is an acute angle, and an included angle θ2 between the second protection layer 140 and the first protection layer 130 is an acute angle. More specifically, the included angle θ1 is between a tangent line of an outer contour of the second protection layer 140 in a portion in contact with a foot of a slope of the substrate 10 and the substrate 10 is an acute angle, and an included angle θ2 between a tangent line of an outer contour of the second protection layer 140 in a portion in contact with a top of a slope of the first protection layer 130 and the first protection layer 130 is an acute angle. Such a design can enable circuits 20 and 22 to be slowly lowered along the outer edges of the first protection layer 130 and the second protection layer 140f. In other words, the circuits 20 and 22 can slowly climb to the outer edges of the first protection layer 130 and the second protection layer 140f. Preferably, the angle θ1 is less than or equal to 45 degrees, and the angle θ2 is greater than or equal to 45 degrees, so that the process yield of the circuits 20 and 22 can be improved.

Of course, in an embodiment not shown, the second protection layer 140 may also be in a platform shape, so that the first protection layer 130 and the second protection layer 140 may also be in a ladder shape. The shape of the second protection layer 140 is not limited to the above.

Furthermore, in the present embodiment, a roughness of the first portion 116 of the outer side wall 115 of the micro light-emitting diode 110 is less than a roughness of the second portion 117. Therefore, the second portion 117 of the outer side wall 115 of the micro light-emitting diode 110 has greater roughness. The greater roughness also provides a better grasping force for the second protection layer 140.

Furthermore, because the micro light-emitting diode 110 is heated in a process of being bonded to the substrate 10, the greater roughness of the second portion 117 of the outer side wall 115 of the micro light-emitting diode 110 can also provide more space for filling the softened second protection layer 140 so as to improve a buffering effect.

It is worth mentioning that a material of the first protection layer 130 is different from a material of the second protection layer 140. In the present embodiment, the material of the first protection layer 130 may be an inorganic material, such as silicon dioxide. The material of the second protection layer 140 may be an organic material, such as an organic polymer layer, a photosensitive layer or a heat sensitive layer. More specifically, the material of the second protection layer 140 includes epoxy resin. Of course, in an embodiment, the second protection layer 140 may also be a lightproof layer, for example, doped with reflective particles or including a black photoresist layer to help forward light emission. Furthermore, in an embodiment, the first protection layer 130 may be, for example, a light transmissive layer, and the second protection layer 140 may be, for example, a lightproof layer to control the amplitude of lateral light emission. Of course, the material of the first protection layer 130 and the material of the second protection layer 140 are not limited thereto.

In the present embodiment, a Young's modulus of the first protection layer 130 is greater than a Young's modulus of the second protection layer 140, so that the first protection layer can provide better protection for the micro light-emitting diode, and the second protection layer 140 can provide better buffering so as to reduce the probability of damage of the micro light-emitting diode 110 in a bonding process.

It should be noted that in order to make the micro light-emitting diode device 100 still have protection of certain strength, a height h1 of the second protection layer 140 on the substrate 10 is less than or equal to 0.5 time a height h2 of the micro light-emitting diode 110 on the substrate 10 so as to balance the buffering effect with the protection strength. Furthermore, in the present embodiment, the height h1 of the second protection layer 140 on the substrate 10 is less than a height h3 of the light-emitting layer 112 on the substrate 10 so as to avoid influence on lateral light emission.

Figure 2:
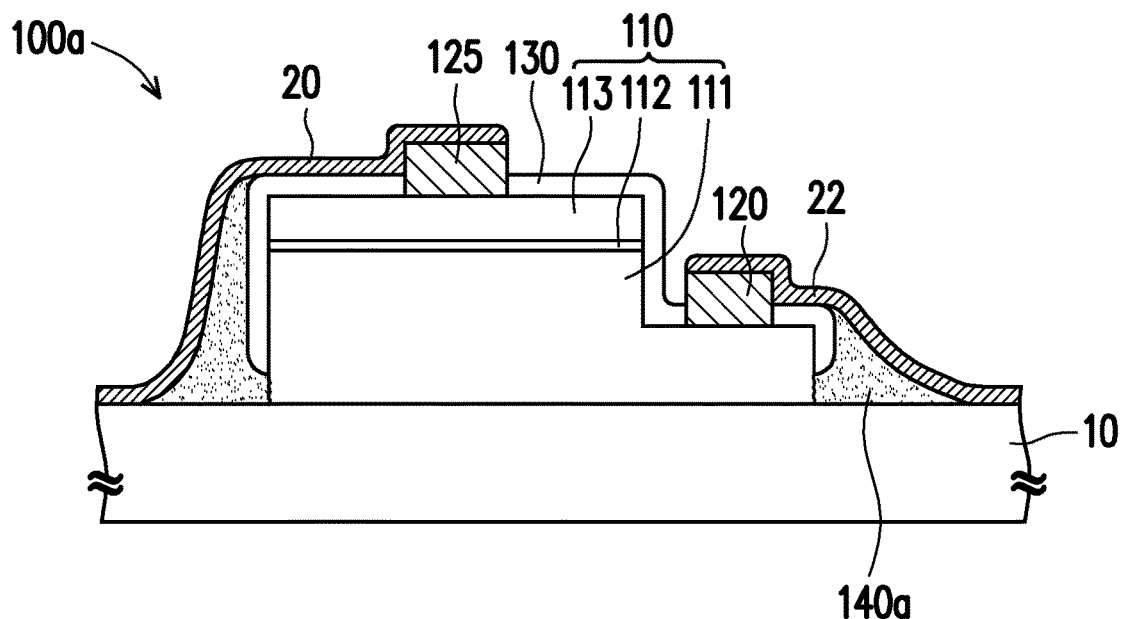
FIG. 2 is a cross-sectional view of a micro light-emitting diode device according to another embodiment of the disclosure.

FIG. 2 is a cross-sectional view of a micro light-emitting diode device according to another embodiment of the disclosure. Referring to FIG. 2, the main difference between a micro light-emitting diode device 100a in FIG. 2 and the micro light-emitting diode device 100 in FIG. 1 is as follows: in the present embodiment, a height of a second protection layer 140a on a substrate 10 is equal to a height of the first protection layer 130 on the substrate 10. In other words, a top surface of the second protection layer 140a may be flush with a top surface of the first protection layer 130. The circuits 20 and 22 extend along the top surface of the first protection layer 130 and extend obliquely downward along the outer contour of the second protection layer 140a.

Figure 3:
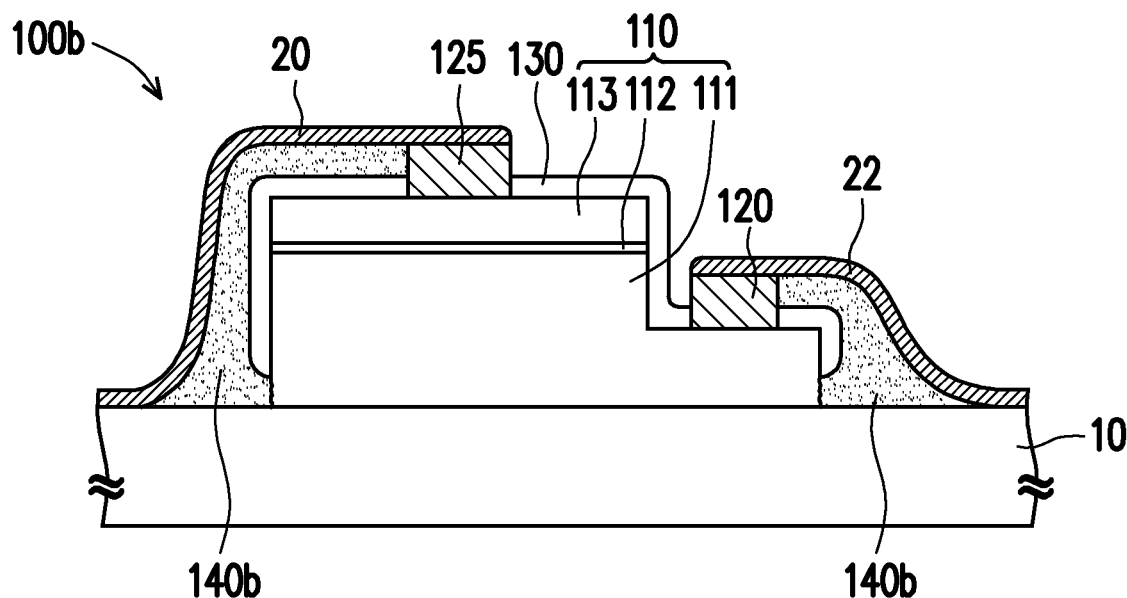
FIG. 3 is a cross-sectional view of a micro light-emitting diode device according to another embodiment of the disclosure.

FIG. 3 is a cross-sectional view of a micro light-emitting diode device according to another embodiment of the disclosure. Referring to FIG. 3, the main difference between a micro light-emitting diode device 100b in FIG. 3 and the micro light-emitting diode device 100 in FIG. 1 is as follows: in the present embodiment, the height of a second protection layer 140b on the substrate 10 is greater than the height of a first protection layer 130 on the substrate 10. In other words, the second protection layer 140b may also cover at least a part of the top surface of the first protection layer 130. In such an embodiment, the circuits 20 and 22 may firstly only extend horizontally along the surface of the second protection layer 140b and then extend obliquely downward without necessarily contacting the first protection layer 130. Here, the surface of the second protection layer 140b is flush with the surfaces of the first type electrode 120 and the second type electrode 125 respectively, so that the subsequently disposed circuits 20 and 22 have better process yield.

Figure 4:
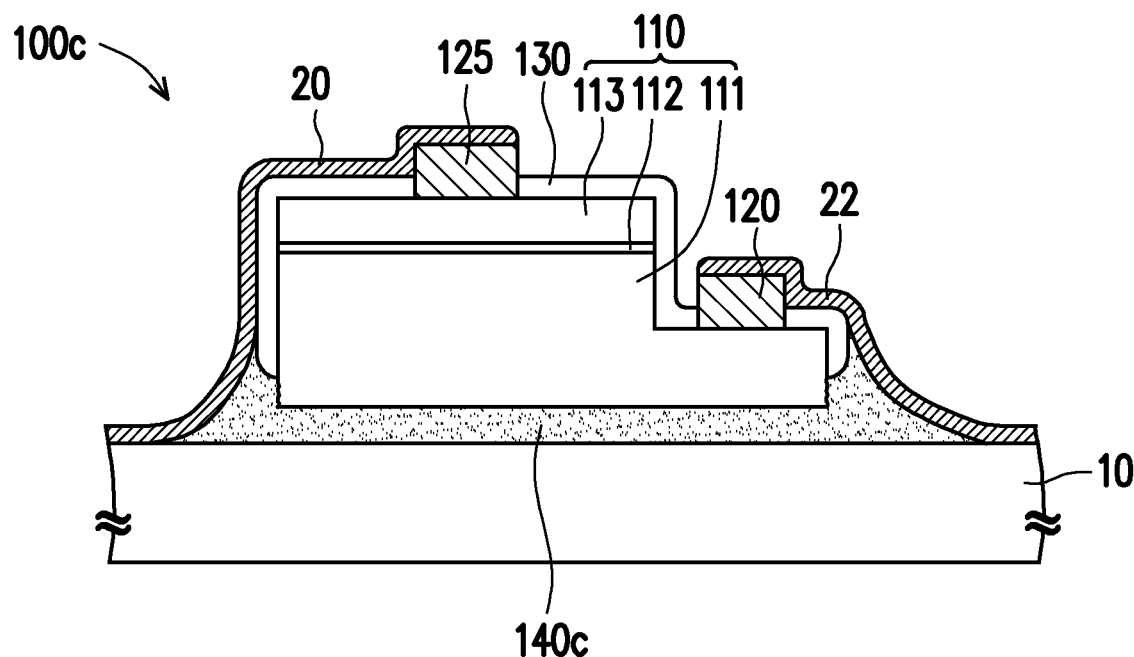
FIG. 4 is a cross-sectional view of a micro light-emitting diode device according to another embodiment of the disclosure.

FIG. 4 is a cross-sectional view of a micro light-emitting diode device according to another embodiment of the disclosure. Referring to FIG. 4, the main difference between a micro light-emitting diode device 100c in FIG. 4 and the micro light-emitting diode device 100 in FIG. 1 is as follows: in the present embodiment, a second protection layer 140c is further disposed on a bottom surface of a micro light-emitting diode 110 and between the micro light-emitting diode 110 and the substrate 10 to provide a better buffering effect, thereby reducing the probability that the micro light-emitting diode device 100c is damaged by the pressure in a process of bonding the micro light-emitting diode device 100c to the substrate 10.

It is worth mentioning that in an embodiment not shown, a second protection layer 140c may be provided with a hole in a portion corresponding to the bottom surface of the micro light-emitting diode 110, and the hole occupies 10% to 90%, for example, 30% to 60%, of the area of the bottom surface of the micro light-emitting diode 110. In an embodiment, the holes may be randomly arranged or arranged in array. A designer can adjust the number and positions of the holes as needed to provide a special buffering effect in response to temperature change or in a specific position. The hole formed in the second protection layer 140b can reduce the probability that the micro light-emitting diode device 100c is deformed and cracked due to thermal expansion and cold contraction caused by temperature change.

Furthermore, the thickness of the portion of the second protection layer 140c below the bottom surface of the micro light-emitting diode 110 can be adjusted according to needs. For example, the heights of the micro light-emitting diodes 110 capable of emitting light of different colors (red, blue and green) may be different. If the heights of light emission surfaces of these micro light-emitting diodes 110 capable of emitting light of different colors (red, blue and green) need to be equal, a designer can adopt second protection layers 140c of different thicknesses to enable these micro light-emitting diode devices 100c to have the same height on the substrate 10.

Figure 5:
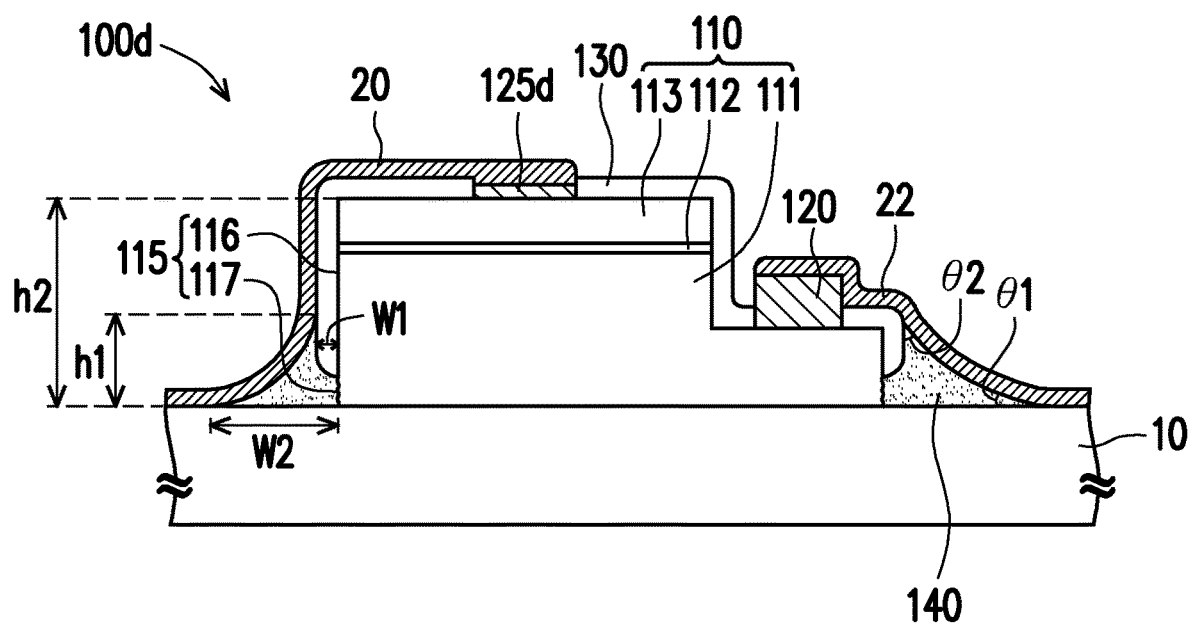
FIG. 5 is a cross-sectional view of a micro light-emitting diode device according to another embodiment of the disclosure.

FIG. 5 is a cross-sectional view of a micro light-emitting diode device according to another embodiment of the disclosure. Referring to FIG. 5, the main difference between a micro light-emitting diode device 100d in FIG. 5 and the micro light-emitting diode device 100 in FIG. 1 is as follows: in the present embodiment, a second type electrode 125d is lower than a surface of the first protection layer 130 and is disposed in the first protection layer 130, the circuit 20 may be disposed in a groove formed by the first protection layer 130 and the second type electrode 125d, and the circuit 20 is better electrically connected to the second type electrode 125d, thereby increasing the yield of the micro light-emitting diode device 100d.

Based on the above, the first protection layer of the micro light-emitting diode device provided by the disclosure is disposed on the first portion of the outer side wall of the micro light-emitting diode, and the second protection layer is disposed on the second portion of the outer side wall of the micro light-emitting diode, is located in the gap between the first protection layer and the substrate, and covers a part of the first protection layer. Therefore, the micro light-emitting diode device provided by the disclosure can be well protected. Furthermore, the material of the first protection layer is different from the material of the second protection layer, thereby providing different protection effects on the micro light-emitting diode. The ratio of the maximum thickness of the first protection layer on the outer side wall to the maximum thickness of the second protection layer on the outer side wall is less than or equal to 0.2. By virtue of the design with a narrow top and a wide bottom, subsequent circuits connected to the micro light-emitting diode can be distributed along the outer edges of the first protection layer and the second protection layer, thereby providing a buffering effect on the circuits to reduce the probability that the circuits are broken.

Furthermore, compared with general light-emitting diode technologies, the micro light-emitting diode is reduced from a millimeter level to a micron level, so that the micro light-emitting diode display can achieve a high resolution and reduce the power consumption of the display, and has the advantages of energy saving, simple structure, thinness and the like.

What is claimed is:

1. A micro light-emitting diode device, comprising:
    a substrate;
    a micro light-emitting diode, disposed on the substrate;
    a first protection layer, disposed on a first portion of an outer side wall of the micro light-emitting diode and having a gap from the substrate; and
    a second protection layer, disposed on a second portion of the outer side wall of the micro light-emitting diode, wherein the second protection layer is in a curved slope shape, the second protection layer is located in the gap between the first protection layer and the substrate and covers a part of the first protection layer, and a maximum thickness of the first protection layer on the outer side wall is less than a maximum thickness of the second protection layer on the outer side wall,
    wherein a circuit is connected to the micro light-emitting diode, and the circuit is in direct contact with the first protection layer and the second protection layer, extends to the substrate along an outer contour of the shape of first protection layer and an outer contour of the curved slope shape of the second protection layer sequentially and electrically connected with the substrate,
    wherein the curved slope shape of the second protection layer in a thickness of the second protection layer on the substrate is gradually increased along a direction away from the first protection layer,
    wherein an included angle between the second protection layer and the substrate is an acute angle, and an included angle between the second protection layer and the first protection layer is an acute angle,
    wherein the included angle between the second protection layer and the substrate is less than or equal to 45 degrees, and the included angle between the second protection layer and the first protection layer is greater than or equal to 45 degrees.

2. The micro light-emitting diode device according to claim 1, wherein a ratio of the maximum thickness of the first protection layer on the outer side wall to the maximum thickness of the second protection layer on the outer side wall is less than or equal to 0.2.

3. The micro light-emitting diode device according to claim 1, wherein a material of the first protection layer is different from a material of the second protection layer.

4. The micro light-emitting diode device according to claim 3, wherein a Young's modulus of the first protection layer is greater than a Young's modulus of the second protection layer.

5. The micro light-emitting diode device according to claim 1, wherein a height of the second protection layer on the substrate is less than or equal to 0.5 time a height of the micro light-emitting diode on the substrate.

6. The micro light-emitting diode device according to claim 1, wherein the micro light-emitting diode comprises a light-emitting layer, and a height of the second protection layer on the substrate is less than a height of the light-emitting layer on the substrate.

7. The micro light-emitting diode device according to claim 1, wherein a roughness of the first portion of the outer side wall of the micro light-emitting diode is less than a roughness of the second portion.

8. The micro light-emitting diode device according to claim 1, wherein a height of the second protection layer on the substrate is greater than or equal to a height of the first protection layer on the substrate.

9. The micro light-emitting diode device according to claim 1, wherein the second protection layer is further disposed on a bottom surface of the micro light-emitting diode and between the micro light-emitting diode and the substrate.

10. The micro light-emitting diode device according to claim 1, wherein the second protection layer is a lightproof layer, the second protection layer covers at least a portion of the first protection layer, and the first protection layer is a light transmissive layer.

11. The micro light-emitting diode device according to claim 1, wherein a portion of the circuit in contact with the second protection layer does not have a right-angle corner.

12. The micro light-emitting diode device according to claim 1, wherein the included angle between the second protection layer and the substrate is less than the included angle between the second protection layer and the first protection layer.

13. A micro light-emitting diode device, comprising:
a substrate;
a micro light-emitting diode, disposed on the substrate;
a first protection layer, disposed on a first portion of an outer side wall of the micro light-emitting diode and having a gap from the substrate; and
a second protection layer, disposed on a second portion of the outer side wall of the micro light-emitting diode, wherein the second protection layer is in a curved slope shape, the second protection layer is located in the gap between the first protection layer and the substrate and covers a part of the first protection layer, and a maximum thickness of the first protection layer on the outer side wall is less than a maximum thickness of the second protection layer on the outer side wall,
wherein a circuit is connected to the micro light-emitting diode, and the circuit is in direct contact with the first protection layer and the second protection layer, extends to the substrate along an outer contour of the shape of first protection layer and an outer contour of the curved slope shape of the second protection layer sequentially and electrically connected with the substrate,
wherein a ratio of the maximum thickness of the first protection layer on the outer side wall to the maximum thickness of the second protection layer on the outer side wall is less than or equal to 0.2,
wherein the curved slope shape of the second protection layer in a thickness of the second protection layer on the substrate is gradually increased along a direction away from the first protection layer.

* * * * *